US006721343B2

(12) United States Patent
Kawazoe et al.

(10) Patent No.: US 6,721,343 B2
(45) Date of Patent: Apr. 13, 2004

(54) LASER PROCESSING APPARATUS WITH POSITION CONTROLLER

(75) Inventors: Kenji Kawazoe, Kawanishi (JP); Katsuichi Ukita, Minou (JP)

(73) Assignee: Matsushita Electric Industrial Co., Ltd. (JP)

( * ) Notice: Subject to any disclaimer, the term of this patent is extended or adjusted under 35 U.S.C. 154(b) by 214 days.

(21) Appl. No.: 09/873,299

(22) Filed: Jun. 5, 2001

(65) Prior Publication Data

US 2001/0048701 A1 Dec. 6, 2001

(30) Foreign Application Priority Data

Jun. 6, 2000 (JP) .......................................... 2000-168539

(51) Int. Cl.⁷ ................................................ H01S 3/00
(52) U.S. Cl. ................................ 372/38.02; 372/38.01; 372/38.07
(58) Field of Search ............................ 372/38.01, 38.02, 372/38.07

(56) References Cited

U.S. PATENT DOCUMENTS 5,302,798 A   4/1994   Inagawa et al. ......... 219/121.7
5,450,202 A * 9/1995   Tisue ..................... 356/614
5,632,913 A   5/1997   Mori
5,670,068 A * 9/1997   Kuriyama et al. ...... 219/121.68
5,719,372 A * 2/1998   Togari et al. ........... 219/121.61
5,777,294 A   7/1998   Sugahara et al.
5,969,851 A * 10/1999  Clark et al. .............. 359/345
6,222,870 B1 * 4/2001  Sousa et al. .............. 372/75

FOREIGN PATENT DOCUMENTS

| EP | 0 426 600 A2 | 5/1991 | |
| JP | 61-061123 | 3/1986 | |
| JP | 2000-117476 | 4/2000 | |
| JP | 2001246484 A * | 9/2001 | ........... B23K/26/00 |
| JP | 2002040356 A * | 2/2002 | ........... G02B/26/10 |

* cited by examiner

Primary Examiner—Allan R. Wilson
Assistant Examiner—Matthew E. Warren
(74) Attorney, Agent, or Firm—Parkhurst & Wendel, L.L.P.

(57) ABSTRACT

A laser processing apparatus comprises a laser generator for generating laser light, a laser controller for controlling the laser generator, a positioning unit for positioning the laser light, a control method memory for storing an optimum control method corresponding to the moving distance of the positioning unit, and a position controller for controlling the position of the positioning unit by the optimum control method. Controlling the position by the optimum control method corresponding to the moving distance increases a processing speed.

9 Claims, 10 Drawing Sheets

Fig. 6

| Moving Distance (mm) | Control Method |
| --- | --- |
| 0.001 – 1.499 | Step Position Command Control Method |
| 1.500 – 4.999 | Step Speed Command Control Method |
| 5.000 – 50.000 | Trapezoid Speed Command Control Method |

Fig. 7

| Moving Distance (mm) | Value of Speed Command (mm/ms) |
| --- | --- |
| 1.500 – 2.999 | 10 |
| 3.000 – 4.999 | 2.9 |

Fig. 8

| Moving Distance (mm) | Waiting Time for Settling (ms) |
| --- | --- |
| 0.001 – 1.499 | 1.720 |
| 1.500 – 2.999 | 1.780 |
| 3.000 – 4.999 | 1.600 |
| 5.000 – 50.000 | 1.240 | a: Waiting Time for Settling Corresponding to Moving Distance of 2mm
According to Embodiment
b: Waiting Time for Settling Corresponding to Moving Distance of 50mm
According to Embodiment
c: Waiting Time for Settling in Conventional Processing Apparatus

Fig. 11

| Moving Distance (mm) | Moving Time According to Embodiment (ms) | Moving Time of Conventional Apparatus (ms) | Ratio of Speed (%) |
|---|---|---|---|
| 1.000 | 1.720 | 1.945 | 113 |
| 2.000 | 1.980 | 2.290 | 116 |
| 4.000 | 2.980 | 2.980 | 100 |
| 50.000 | 12.180 | 18.840 | 155 |

LASER PROCESSING APPARATUS WITH POSITION CONTROLLER

FIELD OF THE INVENTION

The present invention relates to a laser processing apparatus such as a laser drilling machine and a laser cutting machine, and more particularly to a laser processing apparatus having a more processing speed.

BACKGROUND OF THE INVENTION

In a electronic component processing and metal plate processing, laser processing such as drilling, cutting and marking is widely practiced. For example, in an electronic component processing, a laser forms an inner via hole (IVH) in an inter-layered connection circuit for a multi-layered printed circuit board (PCB). The laser processing apparatus for the PCB controls the position of a laser light or the PCB and forms holes at specified positions on the PCB.

Recently, as the electronic devices are getting smaller and lighter, high density mounting of electronic components on the multi-playered PCB is accordingly required. As a result, the number of IVHs formed in the multi-layered PCB increases, and a forming-hole speed of the laser processing apparatus for the PCB must further increases to comply accordingly with this increase.

FIG. 12 shows a structure of a conventional laser processing apparatus for a PCB. The apparatus comprises the following components: A laser generator 16 for outputting laser light; A galvano device 15 having a two-axis motor and a mirror mounted on the motor, for positioning the laser light by driving two mirrors reflecting the laser light; A condenser lens 19 for condensing the laser light; a work table 17 for positioning a mounted PCB 20 to be processed by the laser light; And a control unit 14 for controlling the laser generator 16, galvano device 15, work table 17, and the entire processing apparatus.

The control unit 14 includes a laser controller 7 for controlling the laser generator 16, a galvano controller 9 for controlling the galvano device 15, a work table controller 5 for controlling the work table 17, and a main controller 4 for controlling these controllers and for analyzing programs and processing conditions. When a PCB 20 is put on the work table 17, the work table controller 5 controls the position of the processing table 17 so that the processing position of the PCB 20 may be located beneath the condenser lens 19. When the work table 17 is positioned at a specified position, the galvano controller 9 controls the position of the galvano device 15 so that the laser light may be emitted to the specified position of the PCB 20. By this position control, the galvano device 15 drives the two-axis motor and positions the two mirrors at appropriate angles individually. After a waiting time for settling in which the galvano device 15 finishes the positioning, the laser controller 7 sends a laser output command to the laser generator 16 according to the processing conditions (laser pulse width, laser peak value, number of laser pulses, laser frequency, and so on). According to the laser output command, the laser generator 16 generates a laser light 18. The laser light 18 is reflected by two mirrors of the galvano device 15, passes through the condenser lens 19, and is emitted to the PCB 20. A hole is formed at the irradiation point of the laser light 18 on the PCB 20. When the laser output is over, in order to drill a next hole, the positions of the galvano device 15 and work table 17 are controlled again. In this manner, holes are formed by the laser light 18 at desired positions on the PCB 20. The galvano controller 9 controls the position of the galvano device 15 by a predetermined, fixed control method according to an acceleration/deceleration constant, and settling time.

With the fixed control method, acceleration/deceleration constants, and settling time, however, the performance of the galvano device 15 may not be sufficiently exhibited depending on a moving distance. For example, being controlled by a step speed command (no acceleration or deceleration time, at a constant speed), the galvano device 15 may respond to the command after delay due to electrical or mechanical delay. When a high speed command is given for a short moving distance, the motor cannot follow the command completely due to the response delay, or do not exceed the limit acceleration of the galvano device 15. Therefore, a vibration does not occur in the galvano device 15. However, when the moving distance is long, the command lasts longer than the response delay, and the galvano device 15 may exceed the limit acceleration and attempt to follow up the high speed command, thereby causing vibration. Therefore, in the control method of using a fixed speed command regardless of the moving distance, the speed command is limited according to the moving distance. The limited speed command is a lower than the capacity of the apparatus when the moving distance is short, and, as a result, the moving time becomes longer for a shorter moving distance.

Increasing a hole density in relation to the recent higher density tends to shorten the hole position interval. The moving distance of the galvano device becomes shorter accordingly, and an increase of a speed in a short moving distance is accordingly demanded. The conventional control method is not enough to induce a speed performance of the galvano device sufficiently for a short moving distance.

SUMMARY OF THE INVENTION

A laser processing apparatus comprises a laser generator for producing laser light, a laser controller for controlling the laser generator, a positioning unit (a galvano scanner) for positioning the laser light, a control method memory for storing the control method optimum to the moving distance of the positioning unit, an acceleration/deceleration constant memory for storing the acceleration/deceleration constant corresponding to the moving distance of the positioning unit, a waiting-for-settling time memory for storing the waiting time for settling corresponding to the moving distance of the positioning unit, and a position controller (a galvano controller) for controlling the positioning unit. The position controller controlling the position with using the optimum control method, acceleration/deceleration constant and waiting time for settling makes the processing apparatus operate at high speed.

BRIEF DESCRIPTION OF THE DRAWINGS

FIG. 6 shows stored data in a control method memory of the processing apparatus according to the first embodiment.

FIG. 7 shows stored data in an acceleration/deceleration constant memory of the processing apparatus according to the first embodiment.

FIG. 8 shows stored data in a waiting-for-settling time memory of the processing apparatus according to the first embodiment.

FIG. 11 shows a comparison of the moving time between the processing apparatus according to the first embodiment and a conventional apparatus.

DESCRIPTION OF THE PREFERRED EMBODIMENT

First Exemplary Embodiment

Figure 1:
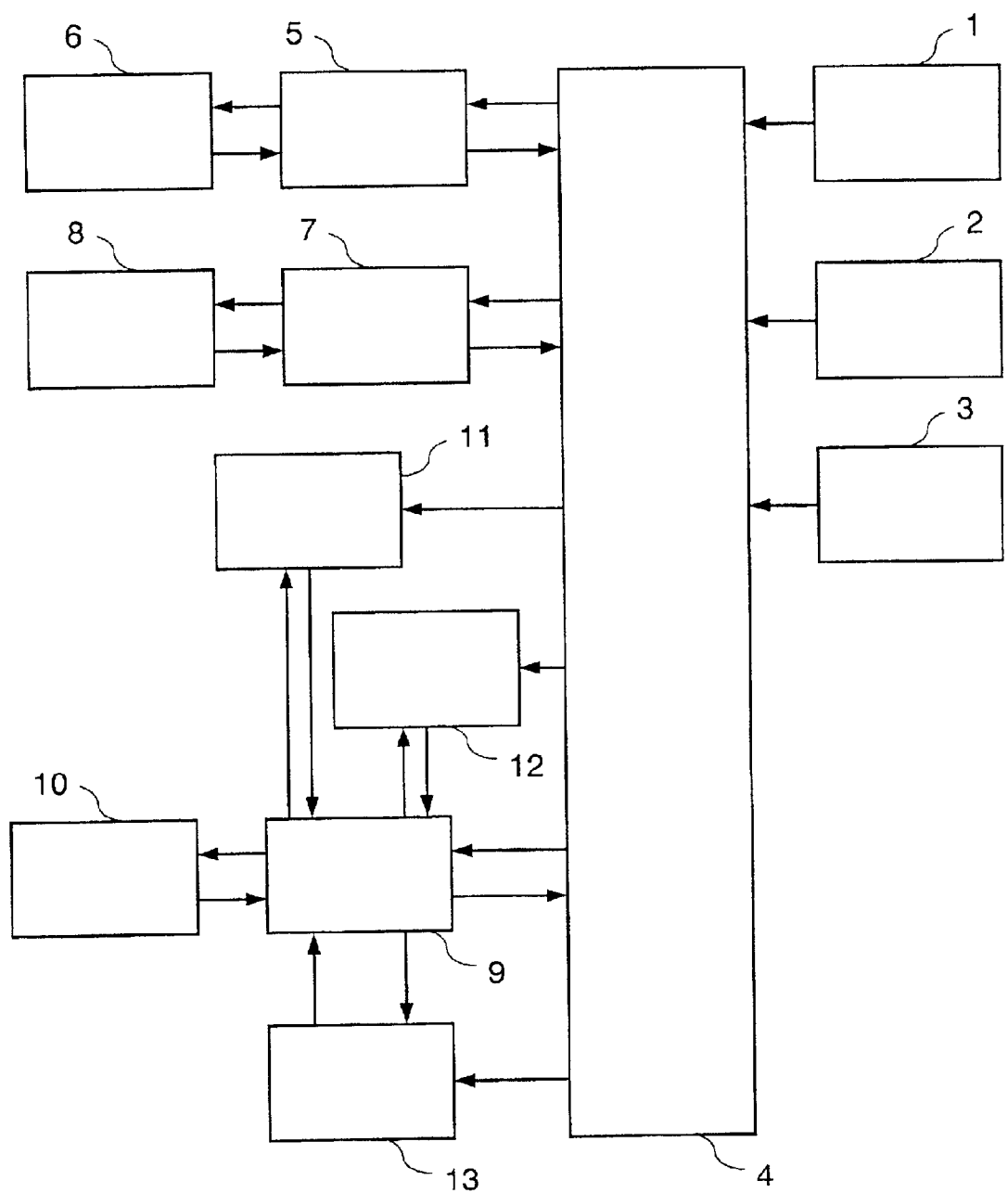
FIG. 1 is a structural diagram of a laser processing apparatus for a printed circuit board (PCB) according to a first exemplary embodiment of the present invention.

FIG. 1 is a structural diagram of laser processing apparatus for printed circuit board (PCB) according to a first exemplary embodiment of the invention. A program input unit 1 enters a processing program such as a hole position information. A processing condition input unit 2 enters laser processing conditions optimum to a diameter of the hole and material and thickness of the PCB to be processed (e.g. laser pulse width, laser peak value, number of laser pulses, laser frequency, and so on.) A parameter input unit 3 enters data to be stored in a control method memory 11, an acceleration/deceleration constant memory 12, and a waiting-for-settling time memory 13, and various operation conditions for the processing apparatus from the outside. A main controller 4 enters the processing program through the program input unit 1, the processing conditions through the processing condition input unit 2, and parameters through the parameter input unit 3. Then, the controller 4 analyzes the data, and creates a work table position command for a work table controller 5, a laser command for a laser controller 7, and a galvano position command for a galvano controller 9. At the time of forming holes, the controller 4 performs sequence control and sends these commands to the respective controllers. The work table controller 5, upon receiving the work table position command from the main controller 4, controls the position of the work table 6 based on the position command, and sends a work table driving signal to the work table 6. The work table controller 5 sends moving-completed information and status information of the work table 6 to the main controller 4. The work table 6 is driven according to the work table driving signal received from the work table controller 5. The status information of the work table 6 is sent to the work table controller 5. The laser controller 7, upon receiving a laser command from the main controller 4, outputs a laser driving signal to the laser generator 8 according to the laser command. The laser controller 6 sends laser-output-complete information and status information of the laser generator 8 to the main controller 4. The laser generator 8, upon receiving the laser driving signal from the laser controller 7, generates laser light according to the laser drive signal. The laser generator 8 sends the status information of the laser generator 8 to the laser controller 7. The galvano controller 9, upon receiving a galvano position command from the main controller 4, controls the position of the galvano scanner 10 according to the galvano position command and sends a galvano driving signal to the galvano scanner 10. The galvano scanner 10 sends moving-complete information and status information of the galvano scanner 10 to the main controller 4. The galvano scanner 10, upon receiving the galvano driving signal from the galvano controller 9, moves mirrors according to the driving signal. The status information of the galvano scanner 10 is sent to the galvano controller 9. The control method memory 11 receives a control method corresponding to a moving distance from the main controller 4. When receiving a moving distance from the galvano controller 9, the memory 11 sends the control method corresponding to the moving distance to the galvano controller 9. The acceleration/deceleration constant memory 12 receives an acceleration/deceleration constant corresponding to a moving distance from the main controller 4. When the moving distance is received from the galvano controller 9, the memory 12 sends an acceleration/deceleration constant corresponding to the moving distance to the galvano controller 9. The waiting-for-settling time memory 13 receives the waiting time for settling corresponding to a moving distance from the main controller 4. When receiving a moving distance from the galvano controller 9, the memory 13 sends a waiting time for settling corresponding to the moving distance to the galvano controller 9.

Figure 2A:
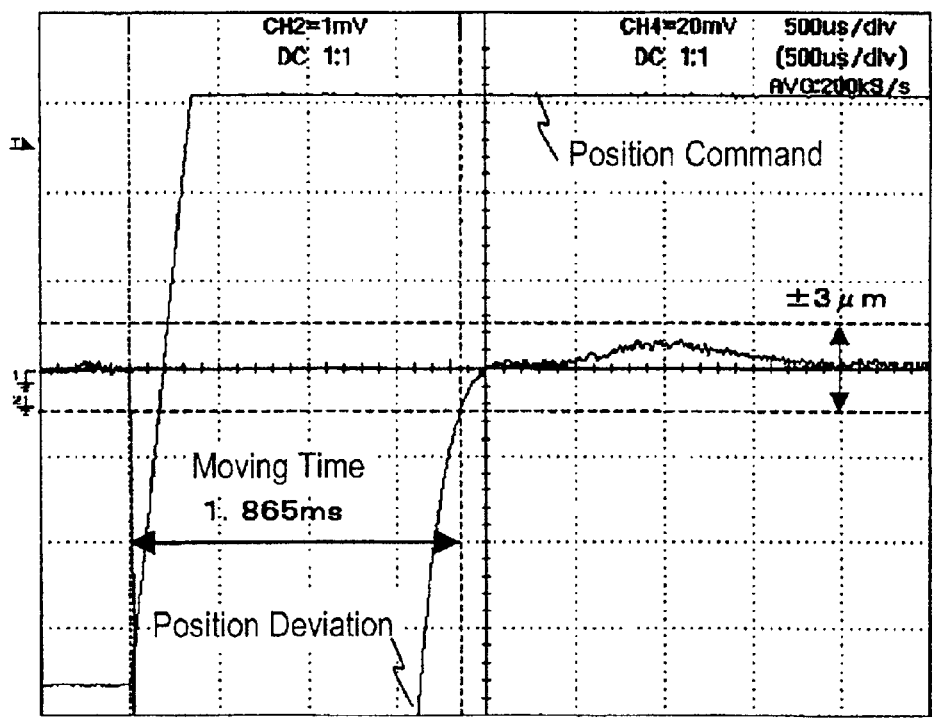
FIG. 2A and FIG. 2B show an operation of a galvano scanner at a moving distance of 1 mm of the processing apparatus according to the first embodiment.
Figure 2B:
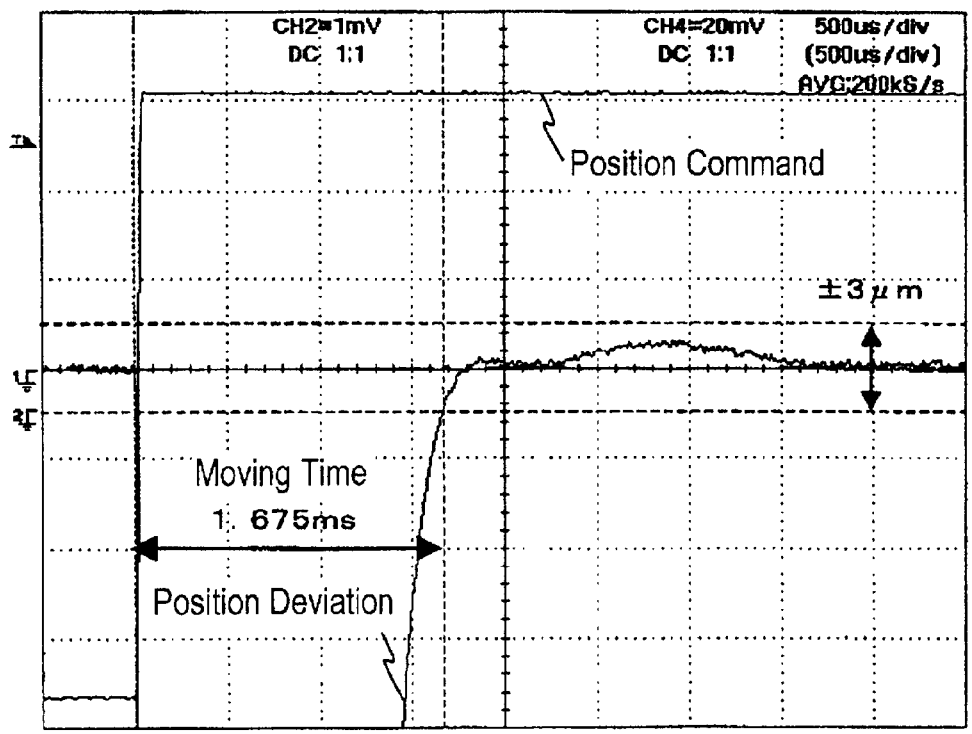
Figure 3A:
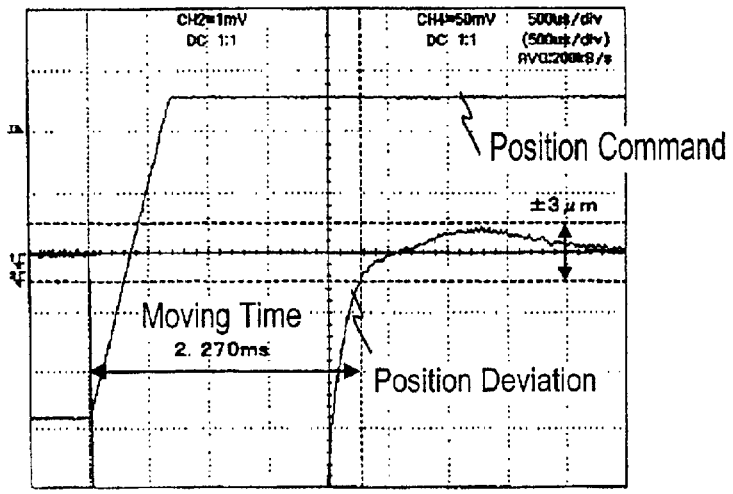
FIG. 3A to FIG. 3C show an operation of the galvano scanner at a moving distance of 2 mm of the processing apparatus according to the first embodiment.
Figure 3B:
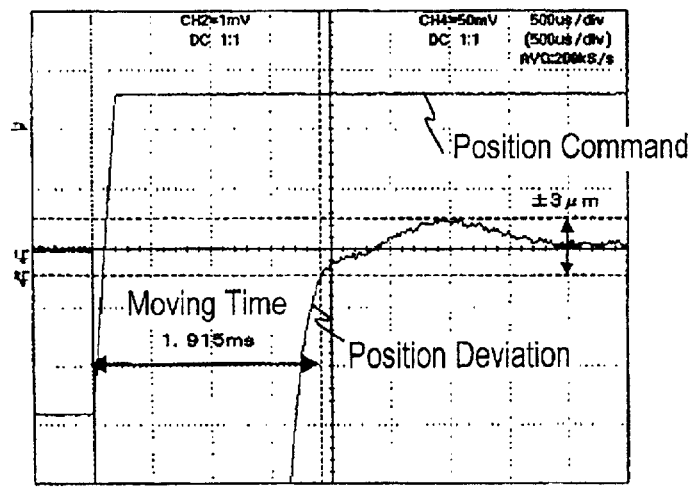
Figure 3C:
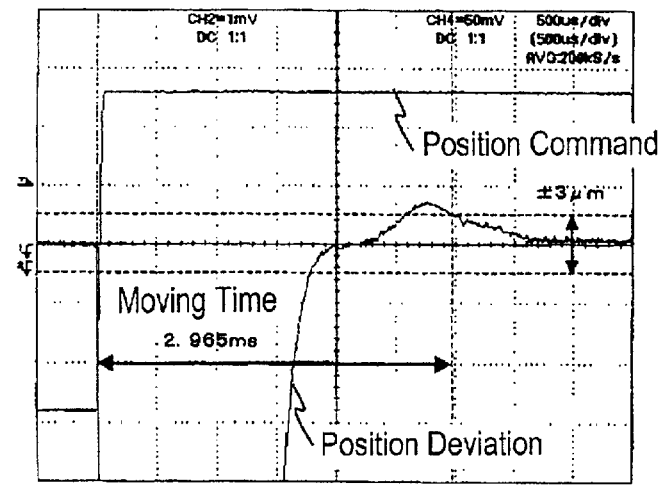
Figure 4A:
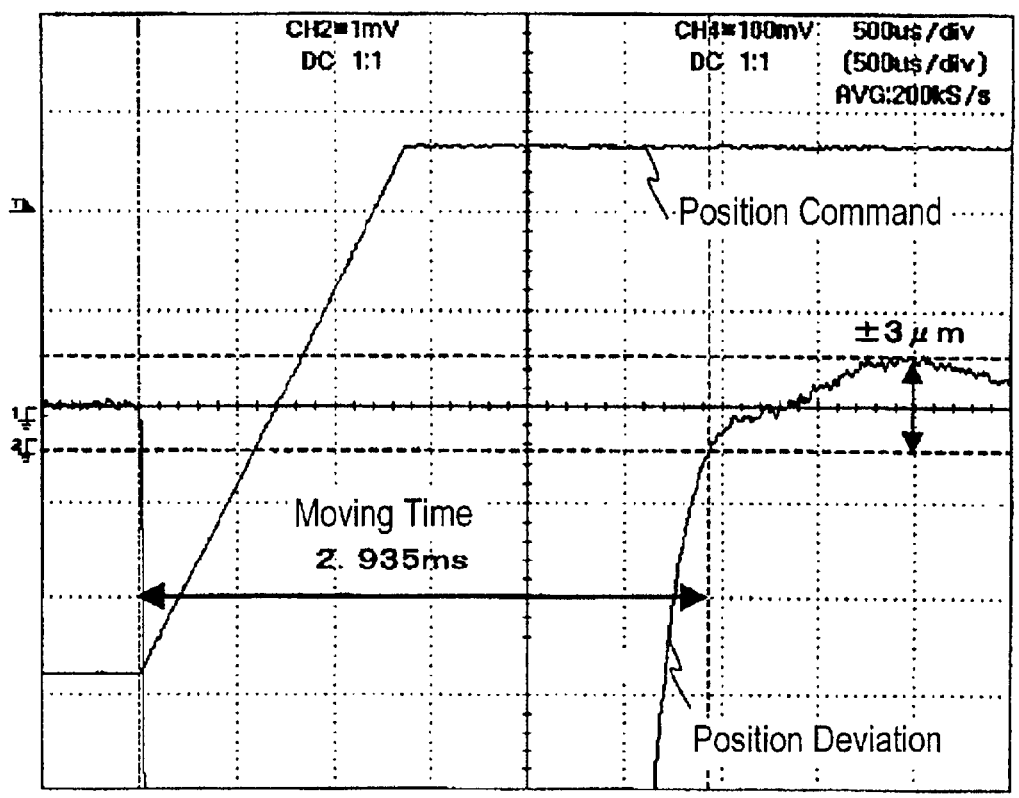
FIG. 4A shows an operation of the galvano scanner at a moving distance of 4 mm of the processing apparatus according to the first embodiment.
Figure 5A:
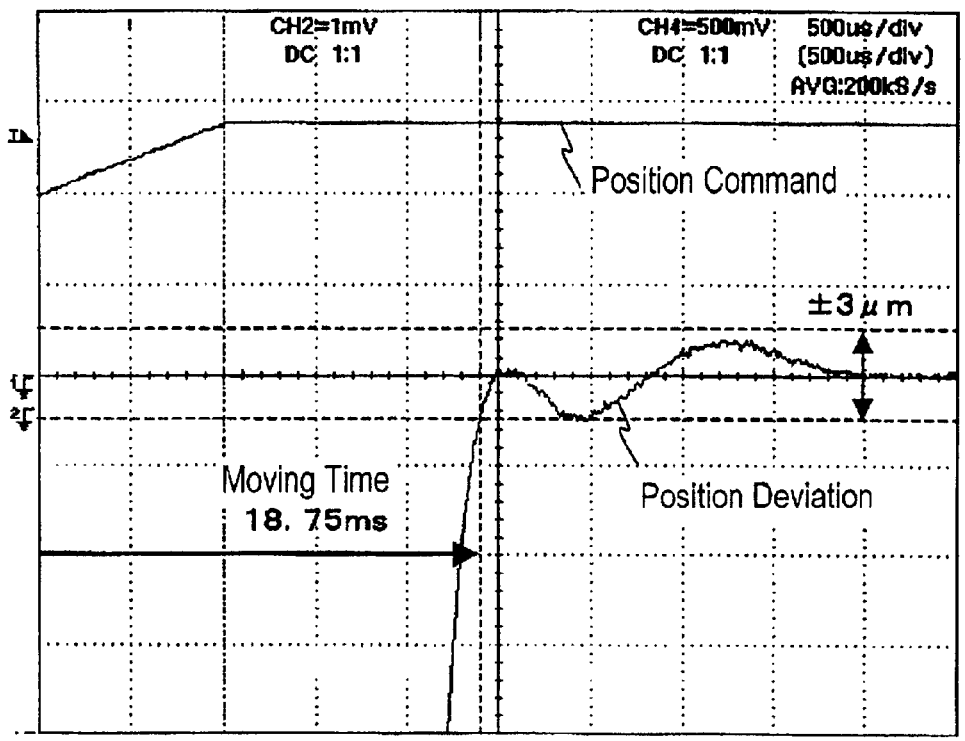
FIG. 5A and FIG. 5B show an operation of a galvano scanner at a moving distance of 50 mm of the processing apparatus according to the first embodiment.
Figure 5B:
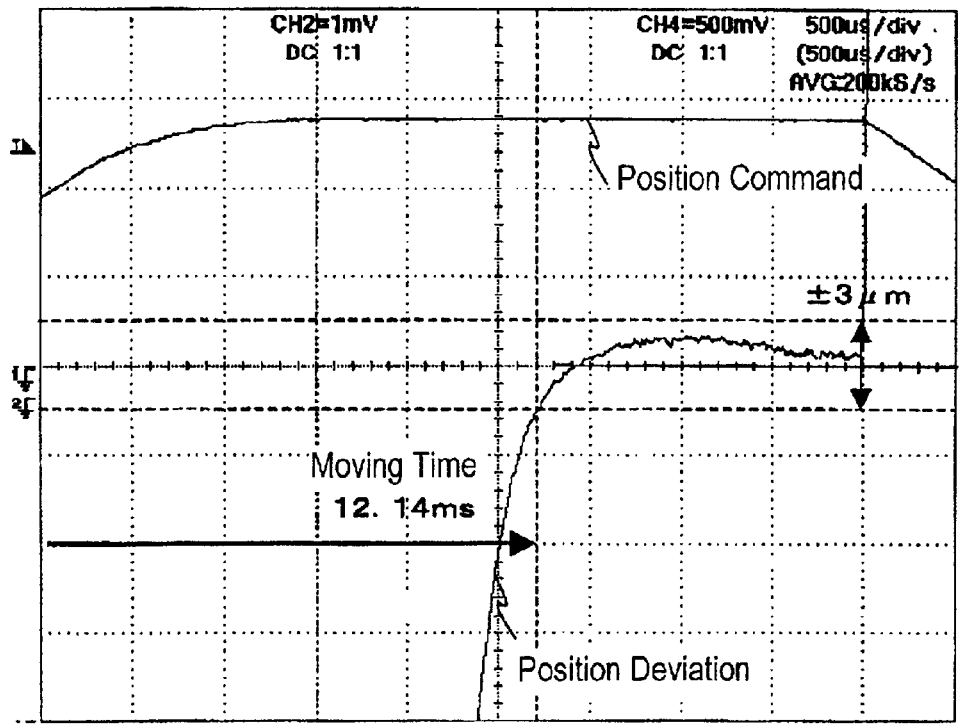

FIG. 2A and FIG. 2B show an operation of the galvano scanner 10 at a moving distance of 1 mm. FIG. 3A to FIG. 3C show an operation of the galvano scanner 10 at a moving distance of 2 mm. FIG. 4A shows an operation of the galvano scanner 10 at a moving distance of 4 mm. FIG. 5A and FIG. 5B show an operation of the galvano scanner 10 at a moving distance of 50 mm. In each diagram, the position command signal and position deviation signal are shown. The maximum moving distance of the galvano scanner 10 according to the embodiment is 50 mm. A position deviation signal of 1 mV corresponds to a position deviation of 6 μm. The laser processing apparatus according to the embodiment has a processing precision of ±20 μm. However, considering the position precision of the work table 6 and the optical correction precision, the galvano scanner 10 is required to have a positioning precision within ±3 μm. When the galvano scanner 10 has the positioning precision within ±3 μm for a target position, that is, when the position deviation signal is within ±0.5 mV, the galvano scanner 10 is regarded to be positioned at the target position. Therefore, the galvano scanner 10 is positioned at the target position after moving with a position deviation within ±3 μm.

FIG. 2A, FIG. 3A, FIG. 4A, and FIG. 4A show the operation of the galvano scanner 10 by a control method of comparative examples. The control method, which is common to each comparative example, includes a step speed command, a speed command of 2.9 mm/ms, and a waiting-for-settling time of 1.600 ms.

FIG. 2A and FIG. 2B show the operation of the galvano scanner 10 of which moving distance is 1 mm. FIG. 2A shows the operation of the comparative example, where the scanner 10 settles at a target position in the moving time of 1.865 ms. FIG. 2B shows the operation of the processing apparatus according to the embodiment, where the scanner 10 settles at a target position in the moving time of 1.675 ms with a speed command of 50 mm/ms. The moving time is shortened by 0.190 ms as compared with the comparative example. The speed command of 50 mm/ms may be regarded as a step position command. Hence, for a short moving distance such as 1 mm, the step position command minimizes the moving time.

FIG. 3A to FIG. 3C show the operation of the galvano scanner 10 of which moving distance is 2 mm. FIG. 3A shows the operation of the comparative example, where the scanner settles at a target position in the moving time of 2.270 ms. FIG. 3B shows the operation of the processing apparatus according to the embodiment, where the scanner 10 settles at the target position in a moving time of 1.915 ms with a speed command of 10 mm/ms. The moving time is shortened by 0.355 ms as compared with the comparative example. FIG. 3C shows a reference example, where a speed command is of 100 mm/ms. This move command may be regarded as a step position command. However, since the speed command is too large, the scanner 10 overshoots and settles at the target position in a moving time of 2.965 ms. Hence, for a medium moving distance such as 2 mm, the step speed command of 10 mm/ms minimizes the moving time.

FIG. 4A shows the operation of the galvano scanner 10 of which moving distance is 4 mm. FIG. 4A shows the operation of the comparative example, where the scanner 10 settles at a target position in a moving time of 2.935 ms. For the moving distance of 4 mm, a speed command of over 2.9 mm/ms, which is given in the control method of the comparative example, makes the scanner 10 overshoots similarly to FIG. 3C because the speed command is too large, and makes the moving time longer. Hence, for a medium moving distance such as 4 mm, the step speed command of 2.9 mm/ms minimizes the moving time.

FIG. 5A and FIG. 5B show the operation of the galvano scanner 10 of which moving distance is 50 mm. FIG. 6A and FIG. 5B show a movement near a target position. A moving time is calculated by adding the settling time from the end of a position command output to a time when a position command is being output. FIG. 5A shows the operation of the comparative example, where the scanner 10 settles at a target position in a moving time of 18.75 ms. FIG. 5B shows the operation of the apparatus according to the embodiment, where the scanner settles the target position in a moving time of 12.14 ms with a trapezoidal speed command having a linear acceleration/deceleration time of 0.94 ms and a speed command of 5 mm/ms. The moving time is shortened by 6.61 ms as compared with the comparative example. The trapezoidal speed command control method sets the speed command larger than the conventional control method by smoothly raising the speed command, hence reducing the moving time. Hence, for a long moving distance such as 50 mm, the trapezoidal speed command minimizes the moving time.

Thus, the optimum position control method for the galvano scanner 10 is provided. That is, the step position command control method is optimum to a short moving distance, the step speed command control method is optimum to a medium moving distance, and the trapezoidal speed command control method is optimum to a long moving distance.

FIG. 6 is a table of control methods corresponding to moving distances obtained from a precise measurement with moving distances. The table in FIG. 6 is stored in the control method memory 11. As mentioned above, the step speed command control method is employed for both moving distance of 2 mm (FIG. 3A to FIG. 3C) and moving distance of 4 mm (FIG. 4A). However, the values of the speed command are different, that is, 10 mm/ms at a moving distance of 2 mm, and 2.9 mm/ms at a moving distance of 4 mm.

FIG. 7 is a table of a value of the speed command corresponding to the moving distance obtained from a precise measurement with moving distances. The table in FIG. 7 is stored in the acceleration/deceleration constant memory 12. In the table, the moving distance is classified into two, but the distance may be classified into more. In the trapezoidal speed command control method for a moving distance of 5 mm or more, a table including acceleration/deceleration constants corresponding to moving distances may be stored in the acceleration/deceleration constant memory 12.

Then, data in the waiting-for-settling time memory 13 will be explained. The settling time of the galvano scanner 10 controlled by the control method and acceleration/deceleration constants stored in the control method memory 11 and acceleration/deceleration constant memory 12 is determined by subtracting a time when the move command is being output from the moving time. The settling time is 1.675 ms at a moving distance of 1 mm in FIG. 2B, 1.715 ms at a moving distance of 2 mm in FIG. 3B, 1.555 ms at a moving distance of 4 mm in FIG. 4A, and 1.200 ms at a moving distance of 50 mm in FIG. 5B.

FIG. 8 is a table of waiting time for settling corresponding to the moving distance determined based on the setting time measured with a precisely-divided moving distance. The table in FIG. 8 is stored in the waiting-for-settling time memory 13. In FIG. 8, the moving distance is classified into four, but the moving distance may be classified into any number.

The operation of the laser processing apparatus for a PCB will be explained below.

Figure 9:
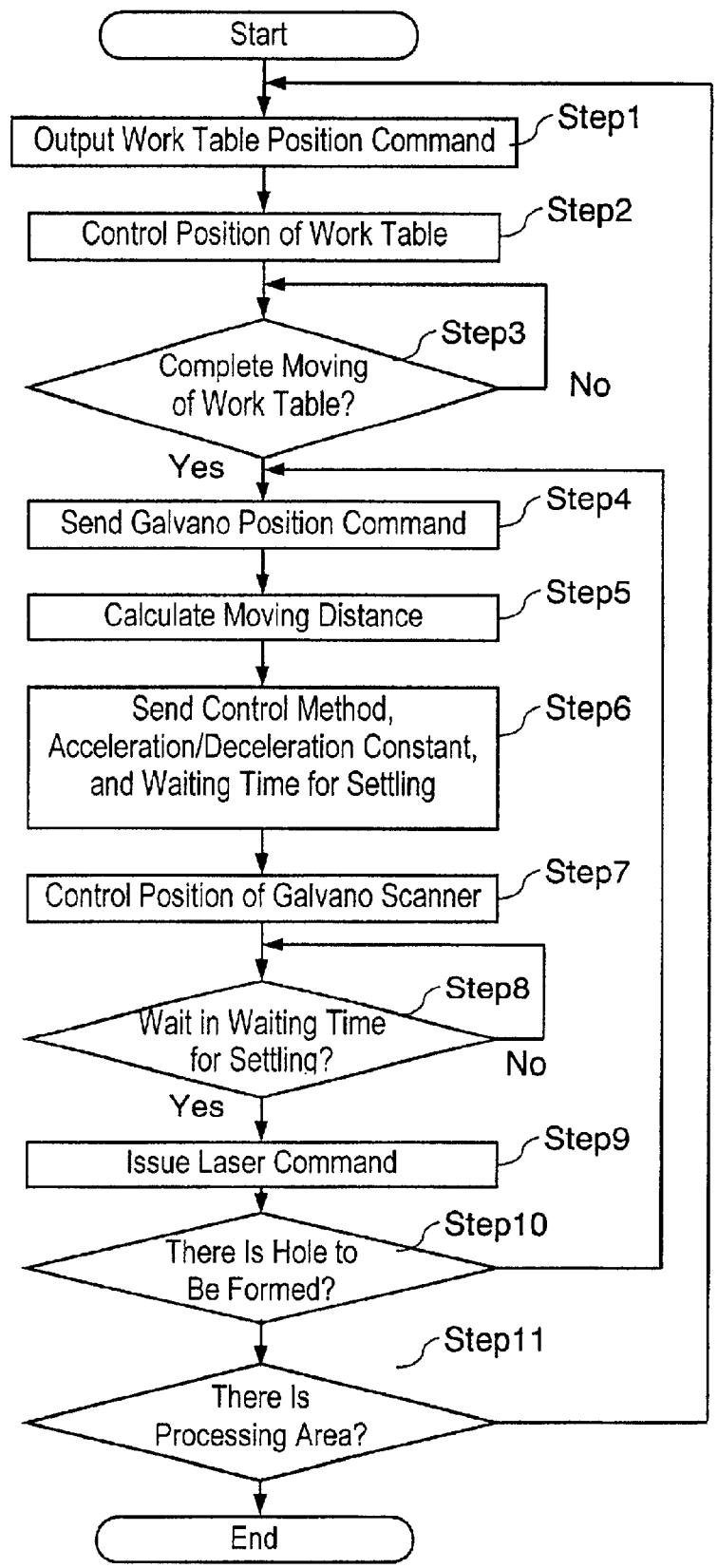
FIG. 9 is a flowchart of an operation of the laser processing apparatus for the PCB according to the first embodiment.

FIG. 9 shows a flowchart of a forming-hole operation of the laser processing apparatus for a PCB. In the main controller 4, the programs, processing conditions and parameters are entered preliminarily from the program input unit 1, processing condition input unit 2, and parameter input unit 3, and are analyzed. The control method corresponding to a moving distance of the galvano scanner 10 enters into the control method memory 11. An acceleration/deceleration constant corresponding to the moving distance of the galvano scanner 10 enters into the acceleration/deceleration constant memory 12. A waiting time for settling corresponding to the moving distance of the galvano scanner 10 enters into the waiting-for settling time memory 13. A PCB on which a hole is formed is mounted on the work table. When a hole is started to form, at step 1, the main controller 4 outputs a work table position command to the work table controller 5, so that a specified processing area of the PCB may settle within the irradiation area of a laser light. At step 2, the work table controller 5 controls the position of the work table 6 according to the work table position command, and moves the work table to a target position. At step 3, the main controller 4 waits for moving complete information telling a completion of the moving of the work table to the target position from the work table controller 5. Upon receiving the moving complete information, at step 4, the main controller 4 sends a galvano position command to the galvano controller 9 in order that the laser light is emitted to a specified position in the processing area. At step 5, the galvano controller 9 calculates a moving distance of the galvano scanner 10 according to the galvano position command, and sends the moving distance to the control method memory 11, acceleration/deceleration constant memory 12, and waiting-for-settling time memory 13. At step 6, the control method memory 11 sends a control method corresponding to the moving distance to the galvano controller 9. Similarly, the acceleration/deceleration constant memory 12 sends an acceleration/deceleration constant corresponding to the moving distance to the galvano controller 9, and the waiting-for-settling time memory 13 sends a waiting time for settling corresponding to the moving distance to the galvano controller 9. At step 7, the galvano controller 9 controls the position of the galvano scanner 10 according to the control method from the control method memory 11 and the acceleration/deceleration constant from the acceleration/deceleration constant memory 12, and moves mirrors to the target position. At step 8, the galvano controller 9, upon receiving the waiting time for settling from the waiting-for-settling time memory 13, waits in the waiting time from the end of the move command, and sends waiting time complete information to the main controller 4. At step 9, in order that the laser is output under a processing condition for forming holes at specified processing quality, the main controller 4 issues a laser command to the laser controller 7. The laser controller 7 sends a laser driving signal to the laser generator 8 according to the laser command, and the laser generator 8, upon receiving the signal, generates laser light. The laser light is guided into the galvano scanner 10, reflected by a two-axis mirror of the galvano scanner 10, and emitted to the specified position on the PCB to form a hole. At step 10, the main controller 4 checks whether there is a hole to be formed in the processing area or not. If there is the hole, at step 4, the controller 4 sends a galvano position command corresponding to the hole to be formed to the galvano controller 9. If there is not the hole, at step 11, the main controller 4 further checks where there is other processing area. If there is a processing area, at step 1, the controller 4 sends a work table position command corresponding to the processing area to the work table controller 5. If there is no further processing area, the processing about the entered processing program is completed, and the processing operation ends.

Figure 10:
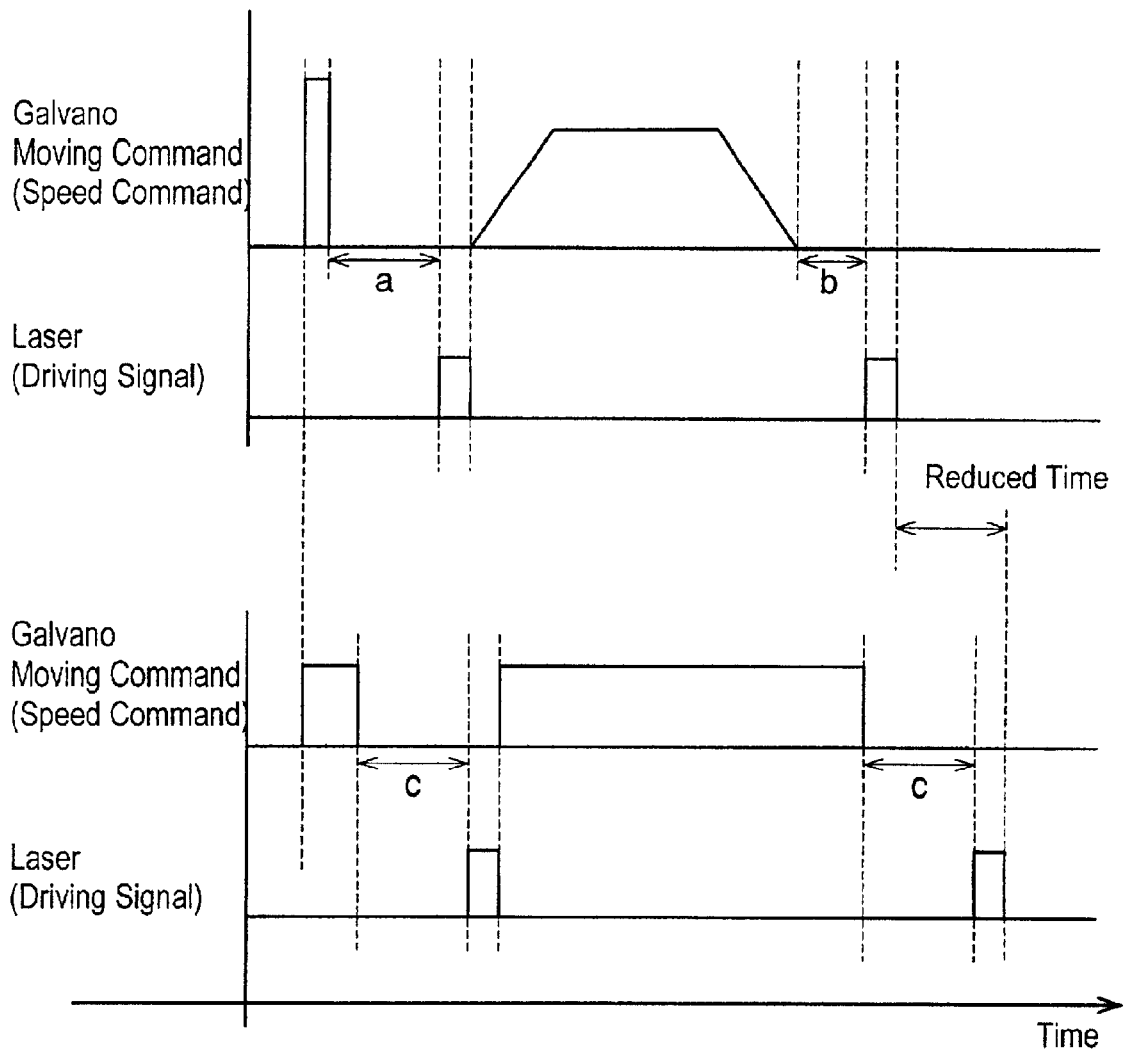
FIG. 10 is a time chart of the laser processing apparatus for the PCB according to the first embodiment.
Figure 12:
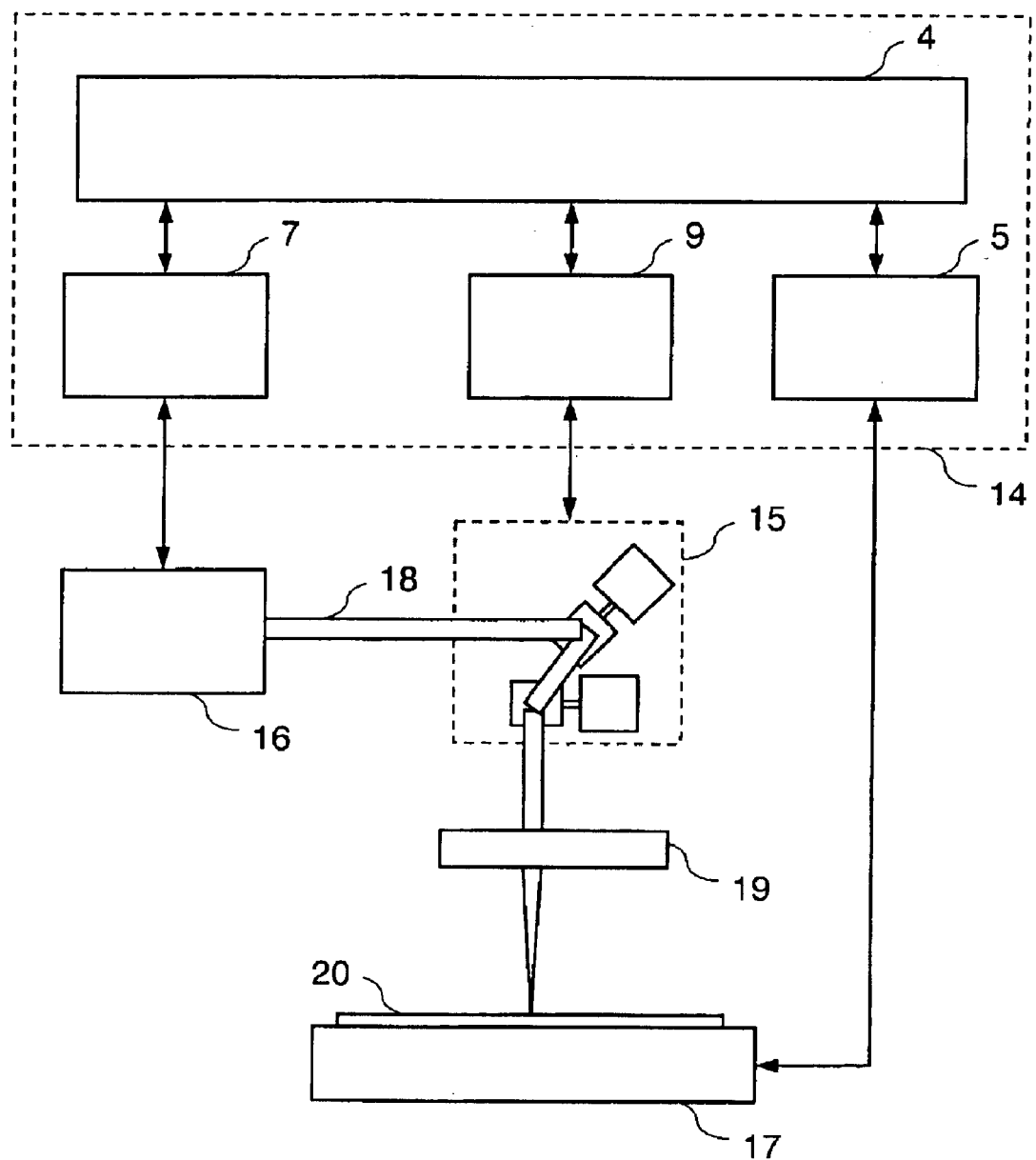
FIG. 12 is a structural diagram of a conventional laser processing apparatus for a printed circuit board (PCB).

FIG. 10 is a time chart of a galvano operation. The chart shows operations for a continuous moving of 2 mm and 50 mm. A processing condition is that a single pulse laser is generated. In a comparative example of the conventional galvano control method, the step speed control command control method is applied to moving distances of both 2 mm and 50 mm, and values of a speed command and waiting times are the same for the distances, respectively. The processing apparatus according to the embodiment of the invention, for the moving distance of 2 mm, employs the step position command control method and the shortest waiting time for settling. The processing apparatus, for the moving distance of 50 mm, employs the trapezoidal speed command control method with a speed command larger than in the conventional apparatus and the shortest waiting time for settling. Therefore, the scanner in the processing apparatus according to the embodiment moves faster than that in the conventional apparatus for the moving distance of both 2 mm and 50 mm.

FIG. 11 shows a comparison of a moving time in each moving distance between the control method according to the embodiment of the invention and the conventional control method as a comparative example. The galvano control method for a moving distance of 4 mm is the same as the conventional control method does not shorten the moving time. However, in other moving distances, the moving time is shortened, and the speed performance is enhanced. Particularly in a moving distance of 50 mm, a ratio of speeds increases by about 155%. For holes whose average pitch of 1.1 mm at a speed of 20000 holes/board to be formed in the control method according to the embodiment of the invention, the processing time is about 8% shorter than that in the conventional control method. Thus, the laser processing apparatus of the invention shortens the processing time with controlling the galvano scanner by employing the control method, acceleration/deceleration constant, and waiting time for settling minimizing a moving time depending on each moving distance.

Shortening the moving time by the galvano control by employing the optimum control method, acceleration/deceleration constant, and waiting time for settling corresponding to the moving distance is herein explained. However, employing one or two of the control method, acceleration/deceleration constant, and waiting time for settling present similar effects.

Second Exemplary Embodiment

A laser processing apparatus according to a second exemplary embodiment of the invention has an acceleration/deceleration constant calculator for calculating an acceleration/deceleration constant from a moving distance of a positioning unit in stead of the acceleration/deceleration constant memory 12 in the processing apparatus according to the first embodiment. A galvano controller 9 controls a position eith using an acceleration/deceleration constant calculated by the acceleration/deceleration constant calculator.

Into the acceleration/deceleration constant calculator, an acceleration and deceleration constant calculating function for calculating an acceleration/deceleration constant corresponding to a moving distance enters from the main controller 4. When receiving the moving distance from the galvano controller 9, the calculator calculates an acceleration/deceleration constant from the moving distance according to the acceleration/deceleration constant calculating function, and send the constant to the galvano controller 9. The other configuration and operation are the same as in the first embodiment.

Since the acceleration/deceleration constant is calculated from the moving distance and the acceleration/deceleration constant calculating function, the processing apparatus does not require a memory for storing a table of an acceleration/deceleration constant corresponding to the moving distance. The acceleration/deceleration constant calculating function may be provided for each classified moving distance, and changed over depending on the moving distance.

Third Exemplary Embodiment

The laser processing apparatus according to a third exemplary embodiment of the invention has a waiting-for-settling time calculating unit for calculating a waiting time for settling from a moving distance of a positioning unit in stead of the waiting-for-settling time memory 13 according to the foregoing embodiments. A galvano controller 9 controls a position with using a waiting time for settling calculated by the waiting-for-settling time calculating unit.

Into the waiting-for-settling time calculating unit, a waiting-for-settling time calculating function for calculating the waiting time for settling corresponding to a moving distance enters from the main controller 4. When receiving the moving distance from the galvano controller 9, the calculator calculates the waiting time for settling from the moving distance according to the waiting-for-settling time calculating function, and sends the waiting time to the galvano controller 9. The other configuration and operation are the same as in the foregoing embodiments.

Since the waiting time for settling is calculated from the moving distance and the waiting-for-settling time calculating function, the processing apparatus does not require a memory for storing a table of waiting time for settling corresponding to the moving distance. The waiting-for-settling time calculating function may be provided for each classified moving distance, and changed over depending on the moving distance.

What is claimed is:

1. A laser processing apparatus comprising:
a laser generator for generating a laser light,
a laser controller for controlling said laser generator,
a positioning unit for positioning the laser light, and
a position controller for selecting a control method from a plurality of control methods, each corresponding to a predetermined moving distance of said positioning unit, and for controlling a position of said positioning unit according to said selected control method.

2. The laser processing apparatus of claim 1, further comprising a control method memory for storing a control method corresponding to the moving distance of said positioning unit, wherein said position controller is for controlling the position of said positioning unit by the control method.

3. The laser processing apparatus of claim 2, wherein said control method memory stores a step position command control method for the moving distance less than a first threshold.

4. The laser processing apparatus of claim 2, wherein said control method memory stores a step speed command control method for the moving distance not less than a second threshold and less than a third threshold.

5. The laser processing apparatus of claim 2, wherein said control method memory stores a trapezoidal speed command control method for the moving distance not less than a fourth threshold or more.

6. The laser processing apparatus of claim 1, further comprising an acceleration/deceleration constant memory for storing an acceleration/deceleration constant corresponding to the moving distance, wherein said position controller controls the position of said positioning unit by using the acceleration/deceleration constant.

7. The laser processing apparatus of claim 1, further comprising an acceleration/deceleration constant calculating unit for calculating an acceleration/deceleration constant corresponding to the moving distance from the moving distance, wherein said position controller controls the position of said positioning unit by using the acceleration/deceleration constant.

8. The laser processing apparatus of claim 1, further comprising a waiting-for-settling time memory for storing a waiting time for settling corresponding to the moving distance, wherein said positioning unit controls the position with using the waiting time for settling.

9. The laser processing apparatus of claim 1, further comprising a waiting-for-settling time calculating unit for calculating a waiting time for settling corresponding to the moving distance from the moving distance, wherein said positioning unit controls the position by using the waiting time for settling.

* * * * *